United States Patent
Slovin et al.

(10) Patent No.: US 10,593,404 B2
(45) Date of Patent: Mar. 17, 2020

(54) ARRAY ARCHITECTURE FOR LARGE SCALE INTEGRATION OF PHASE-CHANGE MATERIAL (PCM) RADIO FREQUENCY (RF) SWITCHES

(71) Applicant: Newport Fab, LLC, Newport Beach, CA (US)

(72) Inventors: Gregory P. Slovin, Irvine, CA (US); Nabil El-Hinnawy, Irvine, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/383,453

(22) Filed: Apr. 12, 2019

(65) Prior Publication Data

US 2020/0058354 A1    Feb. 20, 2020

Related U.S. Application Data (63) Continuation-in-part of application No. 16/228,061, filed on Dec. 20, 2018, and a continuation-in-part of
(Continued)

(51) Int. Cl.
*H01L 45/00* (2006.01)
*G11C 13/00* (2006.01)
*G11C 16/32* (2006.01)

(52) U.S. Cl.
CPC ...... *G11C 13/0069* (2013.01); *G11C 13/0004* (2013.01); *G11C 16/32* (2013.01)

(58) Field of Classification Search
None
See application file for complete search history.

(56) References Cited

U.S. PATENT DOCUMENTS 5,976,932 A    11/1999  Kerber
6,448,576 B1    9/2002  Davis
(Continued)

FOREIGN PATENT DOCUMENTS

WO    WO 2016/028362    2/2016

OTHER PUBLICATIONS

G. Slovin, et al. "AlN Barriers for Capacitance Reduction in Phase-Change RF Switches," in *IEEE Electron Device Letters*, vol. 37, No. 5, pp. 568-571, May 2016.
(Continued)

*Primary Examiner* — Evren Seven
(74) *Attorney, Agent, or Firm* — Farjami & Farjami LLP (57) ABSTRACT

An array includes a shared pulse generator and a plurality of cells. A selected cell the plurality of cells includes a phase-change material (PCM) and a heating element, the heating element being transverse to the PCM. The array further includes a row selector configured to connect the shared pulse generator to the selected cell, and a selector configured to connect the selected cell to a ground. The shared pulse generator provides an electrical pulse to cause the heating element in the selected cell to generate a heat pulse. In one approach, the selected cell also includes a non-linear device such as a diode, and the shared pulse generator provides the electrical pulse to a PCM RF switch of the selected cell through the non-linear device to change a state of the PCM RF switch.

20 Claims, 5 Drawing Sheets

Related U.S. Application Data application No. 16/161,960, filed on Oct. 16, 2018, and a continuation-in-part of application No. 16/114,106, filed on Aug. 27, 2018, and a continuation-in-part of application No. 16/103,490, filed on Aug. 14, 2018, and a continuation-in-part of application No. 16/103,587, filed on Aug. 14, 2018, and a continuation-in-part of application No. 16/103,646, filed on Aug. 14, 2018.

(56) References Cited

U.S. PATENT DOCUMENTS

| | | | |
|---|---|---|---|
| 6,894,305 B2* | 5/2005 | Yi | H01L 45/06 257/2 |
| 7,920,414 B2* | 4/2011 | Lowrey | G11C 5/02 365/113 |
| 8,345,472 B2* | 1/2013 | Lee | G11C 5/147 365/151 |
| 9,257,647 B2 | 2/2016 | Borodulin | |
| 9,362,492 B2 | 6/2016 | Goktepeli | |
| 9,368,720 B1 | 6/2016 | Moon | |
| 9,640,759 B1 | 5/2017 | Curioni | |
| 9,917,104 B1 | 3/2018 | Roizin | |
| 2006/0246712 A1 | 11/2006 | Kim | |
| 2007/0075347 A1 | 4/2007 | Lai | |
| 2007/0247899 A1* | 10/2007 | Gordon | G11C 13/0004 365/163 |
| 2009/0108247 A1* | 4/2009 | Takaura | G11C 13/0004 257/2 |
| 2010/0008127 A1* | 1/2010 | Muraoka | G11C 13/0007 365/148 |
| 2010/0237314 A1* | 9/2010 | Tsukamoto | G11C 11/5678 257/3 |
| 2011/0002158 A1* | 1/2011 | Muraoka | G11C 13/0007 365/148 |
| 2013/0187120 A1 | 7/2013 | Redaelli | |
| 2013/0285000 A1 | 10/2013 | Arai | |
| 2014/0264230 A1 | 9/2014 | Borodulin | |
| 2015/0090949 A1 | 4/2015 | Chang | |
| 2015/0249096 A1* | 9/2015 | Lupino | H01L 27/11898 257/203 |
| 2016/0035973 A1 | 2/2016 | Raieszadeh | |
| 2016/0071653 A1 | 3/2016 | Lamorey | |
| 2017/0092694 A1 | 3/2017 | BrightSky | |
| 2017/0365427 A1 | 12/2017 | Borodulin | |
| 2018/0005786 A1 | 1/2018 | Navarro | |
| 2018/0122825 A1* | 5/2018 | Lupino | G11C 11/1653 |
| 2018/0269393 A1 | 9/2018 | Zhang | |
| 2019/0064555 A1 | 2/2019 | Hosseini | |
| 2019/0067572 A1 | 2/2019 | Tsai | |

OTHER PUBLICATIONS

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

* cited by examiner

ARRAY ARCHITECTURE FOR LARGE SCALE INTEGRATION OF PHASE-CHANGE MATERIAL (PCM) RADIO FREQUENCY (RF) SWITCHES

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material". The present application is also a continuation-in-part of and claims the benefit of and priority to application Ser. No. 16/103,587 filed on Aug. 14, 2018, titled "Design for High Reliability RF Switch Based on Phase-Change Material". The present application is also a continuation-in-part of and claims the benefit of and priority to application Ser. No. 16/103,646 filed on Aug. 14, 2018, titled "PCM RF Switch Fabrication with Subtractively Formed Heater". The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element". The present application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance". The present application is further a continuation-in-part of and claims the benefit of and priority to application Ser. No. 16/228,061 filed on Dec. 20, 2018, titled "Circuits for Reducing RF Signal Interference and for Reducing DC Power Loss in Phase-Change Material (PCM) RF Switches". The disclosures and contents of all of the above-identified applications are hereby incorporated fully by reference into the present application.

BACKGROUND

Phase-change materials (PCMs) are capable of transforming between an amorphous phase and a crystalline phase. For example, a PCM switch may be transformed from a non-conductive amorphous phase to a highly conductive crystalline phase by a crystallizing heat pulse generated by a heating element in response to an electrical pulse from a pulse generator. The PCM switch may subsequently be transitioned back to the non-conductive amorphous phase by an amorphizing heat pulse generated by the heating element in response to another electrical pulse from the pulse generator. Given the ever-increasing reliance on radio frequency (RF) communication, there is particular need for RF switching devices to exploit the advantages provided by PCM switches.

However, in order to reliably change the state of a PCM RF switch, the pulse generator may be very large, and may reduce available area of a semiconductor die. Where the semiconductor die employs numerous additional PCM RF switches (e.g., for selectively reconfiguring an array of RF devices), incorporating numerous additional large pulse generators may not be practical. Moreover, because pulse generators have associated leakage currents, additional pulse generators increase total power losses.

Thus, there is need in the art to reliably progam PCM RF switches while increasing available die area and decreasing sources of leakage currents.

SUMMARY

The present disclosure is directed to an array architecture for large scale integration of phase-change material (PCM) radio frequency (RF) switches, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1:
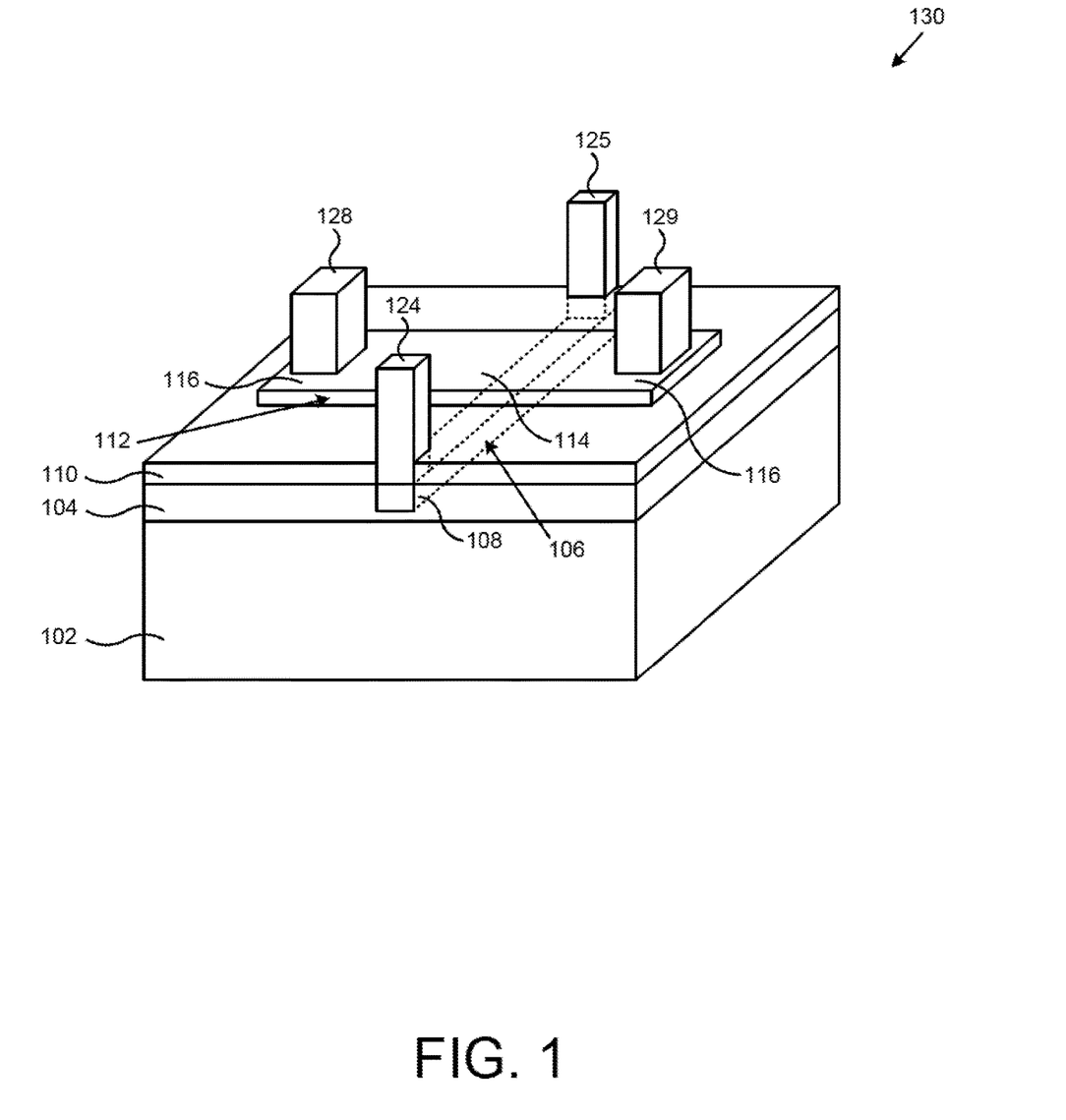
FIG. 1 illustrates a perspective view of a portion of a phase-change material (PCM) radio frequency (RF) switch according to one implementation of the present application.

FIG. 1 illustrates a perspective view of a portion of a phase-change material (PCM) radio frequency (RF) switch according to one implementation of the present application. As shown FIG. 1, PCM RF switch 130 includes substrate 102, lower dielectric 104, heating element 106 having terminal segments 108, thermally conductive and electrically insulating material 110, PCM 112 having active segment 114 and passive segment 116, PCM contacts a 128 and 129, and heater contacts 124 and 125. For purposes of illustration, the perspective view in FIG. 1 shows selected structures of PCM RF switch 130. PCM RF switch 130 may include other structures not shown in FIG. 1.

Substrate 102 is situated under lower dielectric layer 104. In one implementation, substrate 102 is an insulator, such as silicon oxide ($SiO_2$). In various implementations, substrate 102 is a silicon (Si), silicon-on-insulator (SOI), sapphire, complementary metal-oxide-semiconductor (CMOS), bipolar CMOS (BiCMOS), or group III-V substrate. In various implementations, substrate 102 includes a heat spreader or substrate 102 itself performs as a heat spreader. Substrate 102 can have additional layers (not shown in FIG. 1). In one implementation, substrate 102 can comprise a plurality of interconnect metal levels and interlayer dielectric layers. Substrate 102 can also comprise a plurality of devices, such as integrated passive devices (not shown in FIG. 1).

Lower dielectric 104 in PCM RF switch 130 is situated above substrate 102 and below thermally conductive and electrically insulating material 110. As shown in FIG. 1, lower dielectric 104 is also adjacent to sides of heating element 106. Lower dielectric 104 extends along the width of PCM RF switch 130, and is also coplanar with the top of heating element 106. Because PCM RF switch 130 includes lower dielectric 104 on the sides of heating element 106, less heat transfers horizontally (i.e., from the sides) and more heat dissipates vertically, from heating element 106 toward active segment 114 of PCM 112. In various implementations, lower dielectric 104 can have a relative width and/or a relative thickness greater or less than shown in FIG. 1. Lower dielectric 104 can comprise any material with thermal conductivity lower than that of thermally conductive and electrically insulating material 110.

Heating element 106 in PCM RF switch 130 is situated in lower dielectric 104. Heating element 106 also approximately defines active segment 114 of PCM 112. Heating element 106 generates a crystallizing heat pulse or an amorphizing heat pulse for transforming active segment 114 of PCM 112. Heating element 106 can comprise any material capable of Joule heating. Heating element 106 can be connected to electrodes of a pulse generator (not shown in FIG. 1) that generates voltage or current pulses. Preferably, heating element 106 comprises a material that exhibits minimal or substantially no electromigration, thermal stress migration, and/or agglomeration. In various implementations, heating element 106 can comprise tungsten (W), molybdenum (Mo), titanium (Ti), titanium tungsten (TiW), titanium nitride (TiN), tantalum (Ta), tantalum nitride (TaN), nickel chromium (NiCr) or nickel chromium silicon (NiCrSi). For example, in one implementation, heating element 106 comprises tungsten lined with titanium and titanium nitride.

Thermally conductive and electrically insulating material 110 in PCM RF switch 130 is situated on top of heating element 106 and lower dielectric layer, and under PCM 112 and, in particular, under active segment 114 of PCM 112. Thermally conductive and electrically insulating material 110 ensures efficient heat transfer from heating element 106 toward active segment 114 of PCM 112, while electrically insulating heating element 106 from PCM contacts 128 and 129, PCM 112, and other neighboring structures.

Thermally conductive and electrically insulating material 110 can comprise any material with high thermal conductivity and high electrical resistivity. In various implementations, thermally conductive and electrically insulating, material 110 can comprise silicon carbide ($Si_xC_y$), aluminum nitride ($Al_xN_y$), aluminum oxide ($Al_xO_y$), beryllium oxide ($Be_xO_y$), diamond, or diamond-like carbon. In one implementation, thermally conductive and electrically insulating material 110 can be a nugget that does not extend along the width of PCM RF switch 130. For example, thermally conductive and electrically insulating material 110 can be a nugget approximately aligned with heating element 106.

PCM 112 in PCM RF switch 130 is situated on top of thermally conductive and electrically insulating material 110. PCM 112 includes active segment 114 and passive segments 116. Active segment 114 of PCM 112 is approximately defined by heating element 106. Passive segments 116 of PCM 112 extend outward and are transverse to heating element 106, and are situated approximately under PCM contacts 128 and 129. As used herein, "active segment" refers to a segment of PCM that transforms between crystalline and amorphous phases, for example, in response to a crystallizing or an amorphizing heat pulse generated by heating element 106, whereas "passive segment" refers to a segment of PCM that does not make such transformation and maintains a crystalline phase (i.e., maintains a conductive state).

With proper heat pulses and heat dissipation, active segment 114 of PCM 112 can transform between crystalline and amorphous phases, allowing PCM switch 130 to switch between ON and OFF states respectively. Active segment 114 of PCM 112 must be heated and rapidly quenched in order for PCM RF switch 130 to switch states. If active segment 114 of PCM 112 does not quench rapidly enough, it will not transform and PCM RF switch 130 will fail to switch states. How rapidly active segment 114 of PCM 112 must be quenched depends on the material, volume, and temperature of PCM 112. In one implementation, the quench time window can be approximately one hundred nanoseconds (100 ns) or greater or less.

PCM 112 can comprise germanium telluride ($Ge_xTe_y$), germanium antimony telluride ($Ge_xSb_yTe_z$), germanium selenide ($Ge_xSe_y$), or any other chalcogenide. In various implementations, PCM 112 can be germanium telluride having from forty percent to sixty percent germanium by composition (i.e., $Ge_xTe_y$, where $0.4 \leq X \leq 0.6$ and $Y=1-X$). The material for PCM 112 can be chosen based upon ON state resistivity, OFF state electric field breakdown voltage, crystallization temperature, melting temperature, or other considerations. It is noted that in FIG. 1, heating element 106 is transverse to PCM 112. Heating element 106 is illustrated with dashed lines as seen through various structures of PCM RF switch 130. Current flowing in heating element 106 flows approximately under active segment 114 of PCM 112.

PCM contacts 128 and 129 in PCM RF switch 130 are connected to passive segments 116 of PCM 112. Similarly, heater contacts 124 and 125 are connected to terminal segments 108 of heating element 106. PCM contacts 634 and 636 provide signals to and from PCM 626. PCM contacts 128 and 129 provide RIF signals to and from PCM 112. Heater contacts 124 and 125 provide power to heating element 106 for generating a crystallizing heat pulse or an amorphizing heat pulse. PCM contacts 128 and 129 and heater contacts 124 and 125 can extend through various dielectric layers (not shown in FIG. 1). In various implementations, PCM contacts 128 and 129 and heater contacts 124 and 125 can comprise tungsten (W), copper (Cu), or aluminum (Al).

Figure 2:
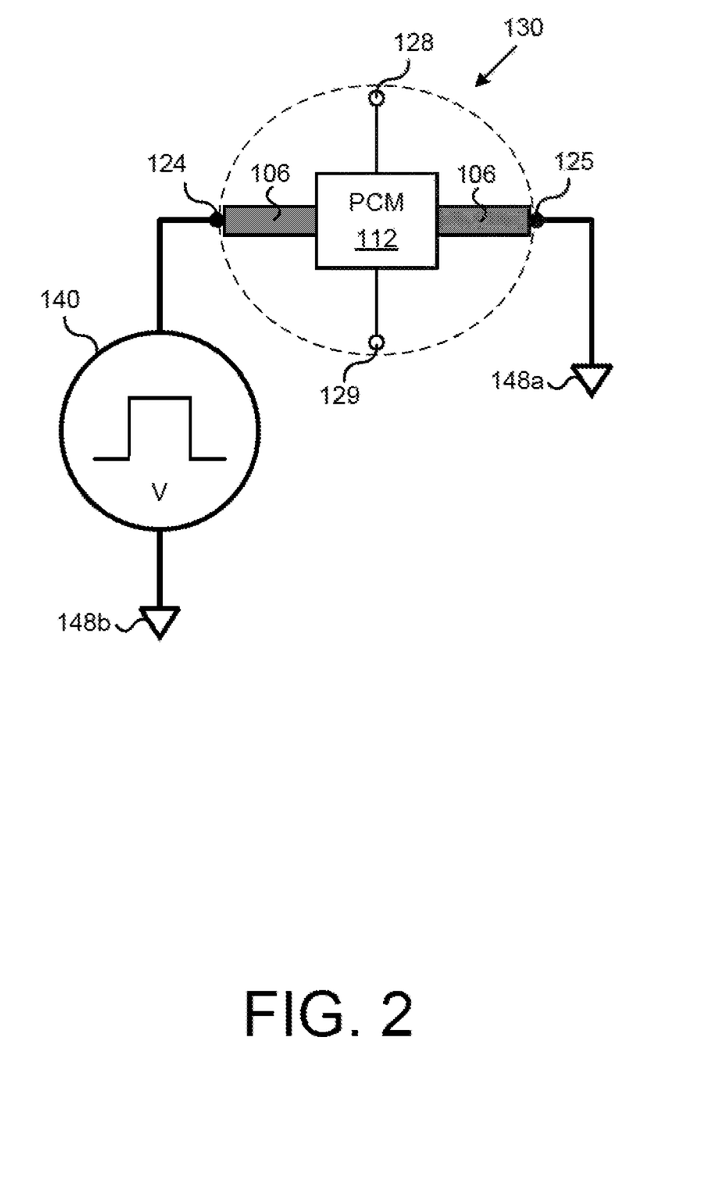
FIG. 2 illustrates a circuit including a PCM RF switch according to one implementation of the present application.

FIG. 2 illustrates a circuit including a PCM RF switch according to one implementation of the present application. The circuit in FIG. 2 includes pulse generator 140 for providing electrical pulses used to program PCM RF switch 130. In the present implementation, pulse generator 140 is a voltage source. In another implementation, pulse generator 140 may be a current source. PCM RF switch 130 includes PCM 112, heating element 106, heater contacts 124 and 125, and PCM contacts 128 and 129. PCM RF switch 130 in FIG. 2 generally corresponds to PCM RF switch 130 in FIG. 1. Also shown in FIG. 2 are DC grounds 148*a* and 148*b*.

As further shown FIG. 2, heating element 106 of PCM RF switch 130 is coupled between pulse get 140 and DC pound 148*a*. That is to say, heater contact 124 is coupled to the output of pulse generator 140, while heater contact 125 is coupled to DC ground 148*a*. Pulse generator 140 is coupled between heating element 106 of PCM RF switch 130 and DC grounds 148*b*. DC grounds 148*a* and 148*b* may be separate grounds or may be a common ground.

Pulse generator 140 provides an electrical pulse to heater contact 124 of PCM RF switch 130, and causes heating element 106 to generate a heat pulse. The heat pulse may be a crystallizing heat pulse that transforms an active segment of PCM 112 from an amorphous phase to a crystalline phase. In the crystalline phase, the active segment of PCM 112 easily conducts electrical current and creates an RF signal path between PCM contacts 128 and 129, and PCM RF switch 130 is in an ON state. The heat pulse may also be an amorphizing heat pulse that transforms an active segment of PCM 112 from a crystalline phase to an amorphous phase. In the amorphous phase, the active segment of PCM 112 does not conduct electrical current well and blocks an RF signal between PCM contacts 128 and 129, and PCM RF switch 130 is in an OFF state. Thus, pulse generator 140 provides an electrical pulse to change the state of PCM RF switch 130.

Thus it is necessary for pulse generator 140 to be large enough to provide sufficient output power in its electrical pulses such that rapid crystallizing and amorphizing heat pulses can be generated by heating element 106. For example, heating element 106 may need an electrical pulse power of approximately one and a half Watts (1.5 W) in order to generate an amorphizing heat pulse. Absent sufficient power generated by pulse generator 140, heating element 106 may fail to transform PCM 112, and pulse generator 140 may fail to change the state of PCM RF switch 130.

However, in order to have the high power handling desired for changing the state of PCM RF switch 130, pulse generator 140 may be very large, and may reduce available area of a semiconductor die. Where the semiconductor die employs numerous PCM RF switches, for example, for selectively reconfiguring an array of RE devices (not shown in FIG. 2), the large size of pulse generator 140 may prohibit using additional pulse generators for each of the numerous PCM RF switches. Accordingly, the circuit of FIG. 2 can undesirably increase die area or degrade performance. Moreover, because pulse generators have associated leakage currents, additional pulse generators increase total power losses.

Figure 3:
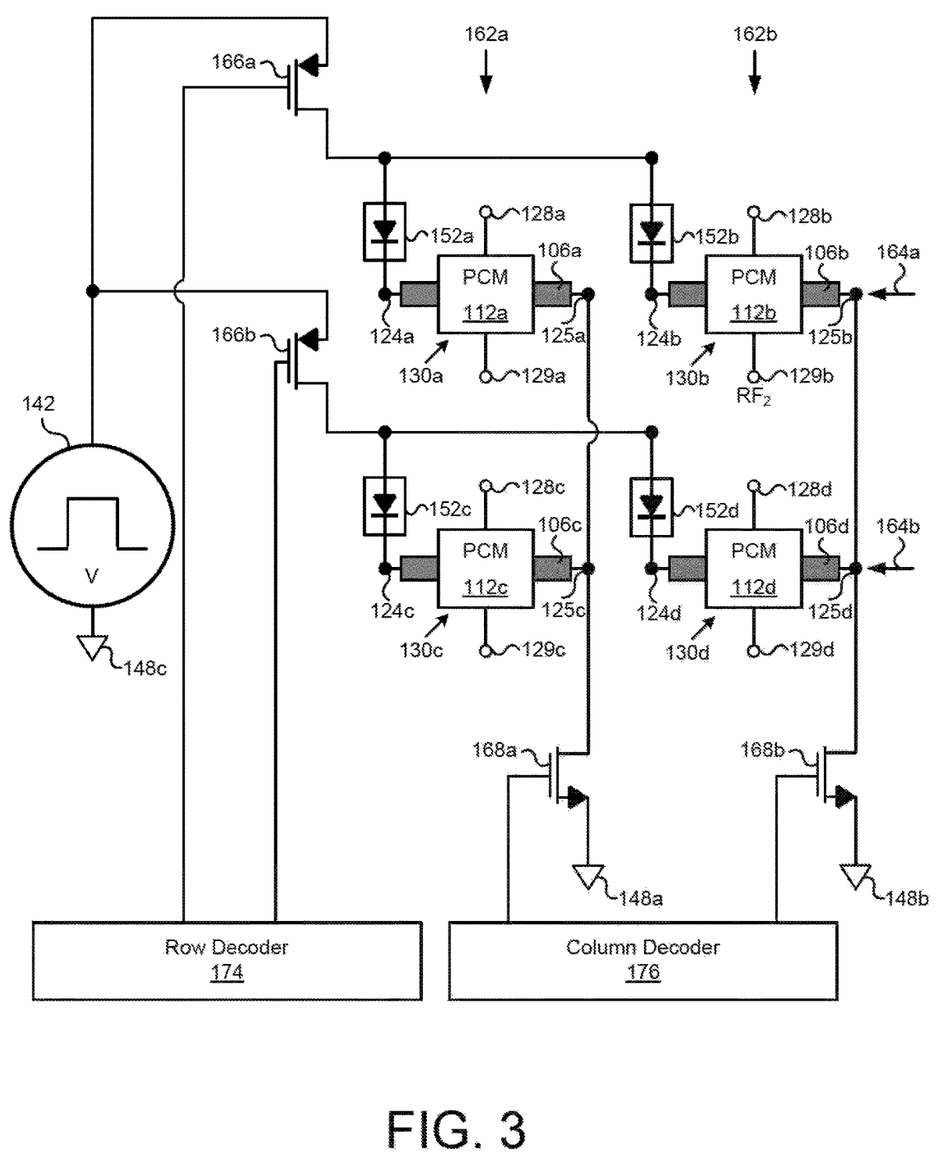
FIG. 3 illustrates an array including a shared pulse generator and PCM switching cells according to one implementation of the present application.

FIG. 3 illustrates an array including a shared pulse generator and PCM switching cells according to one implementation of the present application. The array in FIG. 3 includes cells 130a, 130b, 130c, and 130d arranged in columns 162a and 162b, and rows 164a and 164b. Each of cells 130a, 130b, 130c, and 130d includes a PCM configured to be transformed by amorphizing heat pulse or crystallizing heat pulse, and further includes a corresponding heating element. Specifically, cell 130a includes PCM 112a and heating element 106a, cell 130b includes PCM 112b and heating element 106b, cell 130c includes PCM 112c and heating element 106c, and ell 130d includes PCM 112d and heating element 106d. In addition, each of cells 130a, 130b, 130c, and 130d includes a respective pair of PCM contacts and heater contacts. Specifically, cell 130a has PCM contacts 128a and 129a and heater contacts 124a and 125a, cell 130b has PCM contacts 128b and 129b and heater contacts 124b and 125b, cell 130c has PCM contacts 128c and 129c and heater contacts 124c and 125c, and cell 130d has PCM contacts 128d and 129d and heater contacts 124d and 125d. It is noted that PCMs, heating elements, PCM contacts, and heater contacts in cells 130a, 130b, 130c, and 130d in FIG. 3 generally correspond to complete PCM RF switches, such as PCM RF switch 130 in FIG. 1, and may have any implementations and advantages described above.

FIG. 3 further shows row selectors 166a and 166b for co connecting shared pulse generator 142 to a selected cell of the array, as well as column selectors 168a and 168b for connecting the selected cell to DC pound 148a or 148b respectively. Also shown FIG. 3 are row decoder 174 and column decoder 176. As used in the present application, "selected cell" refers to a cell selected to receive an electrical pulse from shared pulse generator 142. In the implementation of FIG. 3, any of cells 130a, 130b, 130c, and 130d can be a selected cell. At a given time, whether a cell is a selected cell or not depends on whether its corresponding row selector and column selector are enabled. Also, as used in the present application, "shared pulse generator" refers to a pulse generator that can be connected to more than one cell.

In the exemplary implementation of FIG. 3, row decoder 174 is configured to enable row selector 166a or 166b when a cell is selected, and to enable neither when no cell is selected. Likewise, column decoder 176 is configured to enable column selector 168a or 168b when a cell is selected, and to enable neither when no cell is selected. Row decoder 174 and column decoder 176 can be multiplexers connected to logic. Row decoder 174 and column decoder 176 enable row selector 166a or 166b and column selector 168a or 168b based on digital logic code, For example if cell 130a is a selected cell, row decoder 174 enables row selector 166a and column decoder 176 enables column selector 168a.

In the exemplary implementation of FIG. 3, row selectors 166a and 166b are p-type field effect transistors (PFETs), and column selectors 168a and 168b are n-type field effect transistors (NFETs). Continuing the above example, if cell 130a is a selected cell, row decoder 174 provides a low voltage to the gate of PFET row selector 166a to enable row selector 166a. Enabled row selector 166a connects shared pulse generator 142 to selected cell 130a. Column decoder 176 provides a high voltage to the gate of NFET column selector 168a to enable column selector 168a. Enabled column selector 168a connects selected cell 130a to DC ground 148a. Row selector 166b and column selector 168b are not enabled. As a result, the path for an electrical pulse provided by shared pulse generator 142 is through row selector 166a, into heater contact 124a, out of grounded heater contact 125a, and through column selector 168a to ground 148a. Heating element 106a in cell 130a will generate a heat pulse, and the PCM RF switch in cell 130a will change states.

Each of cells 130a, 130b, 130c, and 130d also includes a corresponding non-linear device having an output coupled to its respective heater contact (the non-linear device shown as an exemplary diode in FIG. 3). Specifically, cell 130a includes non-linear device 152a having its output coupled to heater contact 124a (shown as a diode having its cathode coupled to heater contact 124a), cell 130b includes non-linear device 152b having its output coupled to heater contact 124b (shown as a diode having its cathode coupled to heater contact 124b), cell 130c includes non-linear device 152c having its output coupled to heater contact 124c (shown as a diode having its cathode coupled to heater contact 124c), and cell 130d includes non-linear device 152d having its output coupled to heater contact 124d (shown as a diode having its cathode coupled to heater contact 124d).

Within rows 164a and 164b, each non-linear device has an input coupled to a corresponding row selector (the non-linear device shown as an exemplary diode in FIG. 3). Specifically, in row 164a, non-linear device 152a has an input coupled to the drain of row selector 166a (shown as a diode having its anode coupled to the drain of selector 166a) and non-linear device 152b has an input coupled to the drain of row selector 166a (shown as a diode having its anode coupled to the drain of selector 166a), while in row 164b, non-linear device 152c has an input coupled to the drain of row selector 166b (shown as a diode having its anode coupled to the drain of selector 166b) and non-linear device 152d has an input coupled to the drain of row selector 166b (shown as a diode having its anode coupled to the drain of selector 166b).

When cell 130a, 130b, 130c, or 130d is a selected cell, shared pulse generator 142 provides an electrical pulse to a corresponding PCM RF switch through non-linear devices (for example, diodes) 152a, 152b, 152c, or 152d respectively. Continuing the above example, when cell 130a is a selected cell, the path for an electrical pulse provided by shared pulse generator 142 is through row selector 166a, through non-linear device 152a, heater contact 124a, out of grounded heater contact 125a, and through column selector 168a to ground 148a. Non-linear devices (for example, diodes) 152a, 152b, 152c, 152d prevent unselected cells of the array in FIG. 3 from being subjected to electrical programming pulses, and significantly reduce DC power consumption during actuation, as disclosed in U.S. patent application Ser. No. 16/228,061 filed on Dec. 20, 2018, titled "Circuits for Reducing RF Signal Interference and for Reducing DC Power Loss in Phase-Change Material (PCM) RF Switches". The disclosure and content of the above-identified application are incorporated fully by reference into the present application. Notably, where each PCM RF switch has an individual pulse generator, as in FIG. 2, unselected cells are not subjected to electrical programming pulses.

Although the array in FIG. 3 includes two columns and two rows for a total four cells, that representation is provided merely to preserve focus on and for ease of discussion of the present inventive concepts. In other implementations, the array in FIG. 3 may include many more than two rows and/or two columns, and may include many more than four cells. Although row selectors 166a and 166b are illustrated as PFETs and column selectors 168a and 168b are illustrated as NFETs in FIG. 3, in other implementations, row selectors 166a and 166b and column selectors 168a and 168b may be implemented using any other types of selection devices capable of selective electrical connections. Although non-linear devices 152a, 152b, 152c, and 152d are illustrated diodes in FIG. 3, in other implementations, non-linear devices 152a, 152b, 152c, and 152d may be implemented using diode-configured transistors, ovonic threshold switching devices, or resistive memory elements, to name a few alternatives.

The array in FIG. 3 utilizes PCM RF switches, which have low insertion losses, fast switching times, and non-volatile natures, making the array particularly advantageous for RF applications. Also, shared pulse generator 142 can be connected to any of cells 130a, 130b, 130c, or 130d. Using row selectors 166a and 166b and column selectors 168a and 168b, shared pulse generator 142 can reliably provide an electrical pulse to change the state of any of the corresponding PCM RF switches in cells 130a, 130b, 130c, or 130d, without including additional large pulse generators. Accordingly, the array in FIG. 3 advantageously increases available die area and reduces complexity. Moreover, shared pulse generator 142 decreases sources of leakage currents and decreases total power losses.

Figure 4:
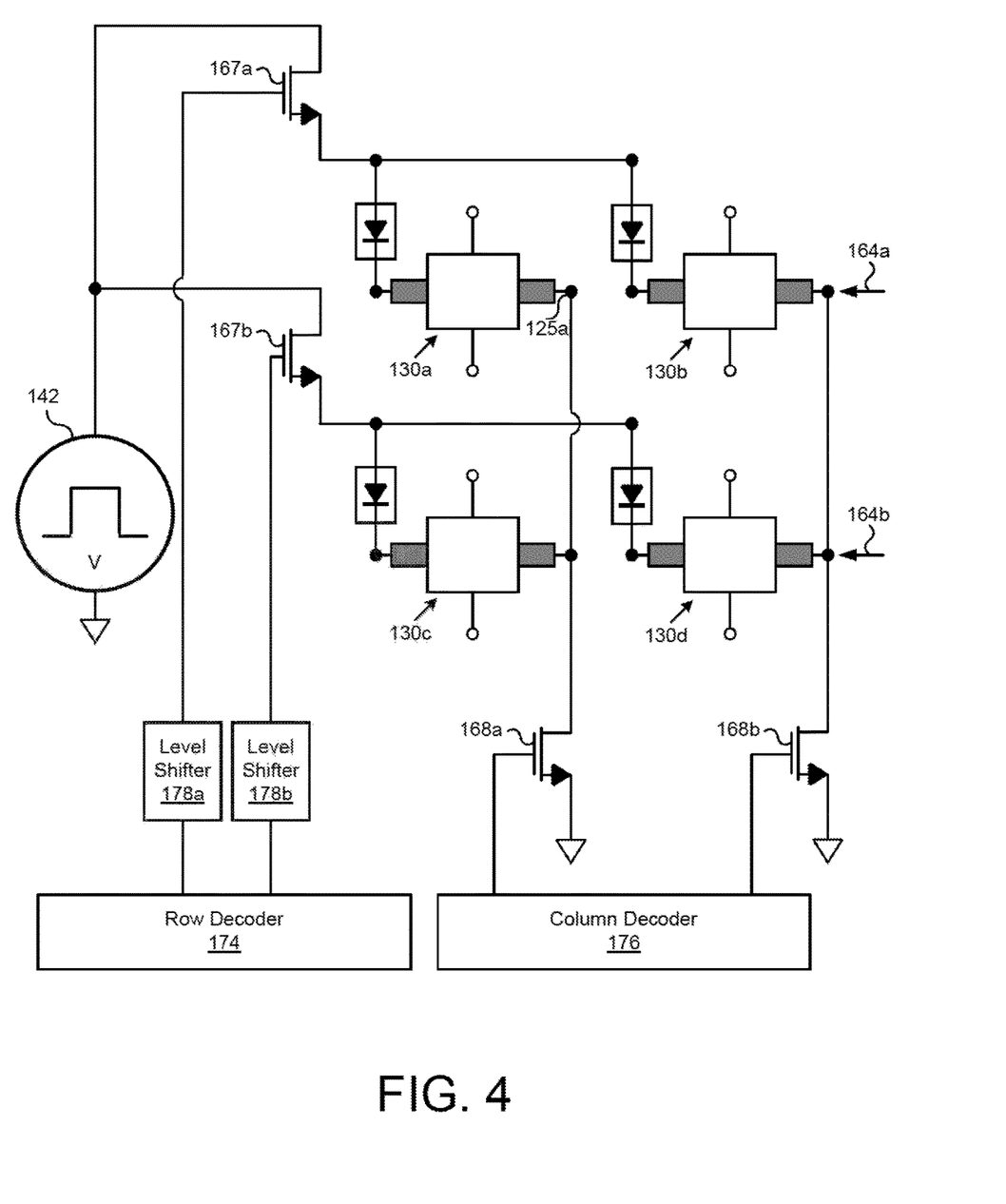
FIG. 4 illustrates an array including a shared pulse generator, PCM switching cells, and n-field effect transistor (NFET) row selectors according to one implementation of the present application.

FIG. 4 illustrates an array including a shared pulse generator, PCM switching cells, and n-type field effect transistor (NFET) row selectors according to one implementation of the present application. The array in FIG. 4 is similar to the array in FIG. 3, except that PFET row selectors 166a and 166b are replaced with NFET row selectors 167a and 167b respectively, and level shifters 178a and 178b are inserted, between row decoder 174 and row selectors 167a and 167b respectively.

Shared pulse generator 142 is intended to provide a sufficiently high voltage/current to result in transformation of the state of each PCM in each selected cell 130a, 130b, 130c, or 130d. However, absent level shifters 178a and 178b, the NFET transistors in row selectors 167a and 167b may not receive a sufficiently high gate voltage from row decoder 174 to enable the NFET transistors to pass the full voltage/current provided by shared pulse generator 142 to each selected cell 130a, 130b, 130c, or 130d. Thus, row selector 167a may fail to provide the full voltage/current generated by shared pulse generator 142 to a selected cell in row 164a, such as cell 130a or 130b, and row selector 167b may fail to provide the full voltage/current generated by shared pulse generator 142 to a selected cell in row 164b, such as cell 130c or 130d. Accordingly, level shifter 178a is inserted between row decoder 174 and row selector 167a, and level shifter 178b is inserted between row decoder 174 and row selector 167b to provide a sufficiently high voltage to the gates of the NFET transistors in row selectors 167a and 167b to ensure that the full voltage/current generated by shared pulse generator 142 is provided to each selected cell in each row in the array. In a similar manner, if column selectors 168a and 168b were PFETs (rather than NFETs as shown in FIG. 4), level shifters may be inserted between column decoder 176 and column selectors 168a and 168b.

Figure 5:
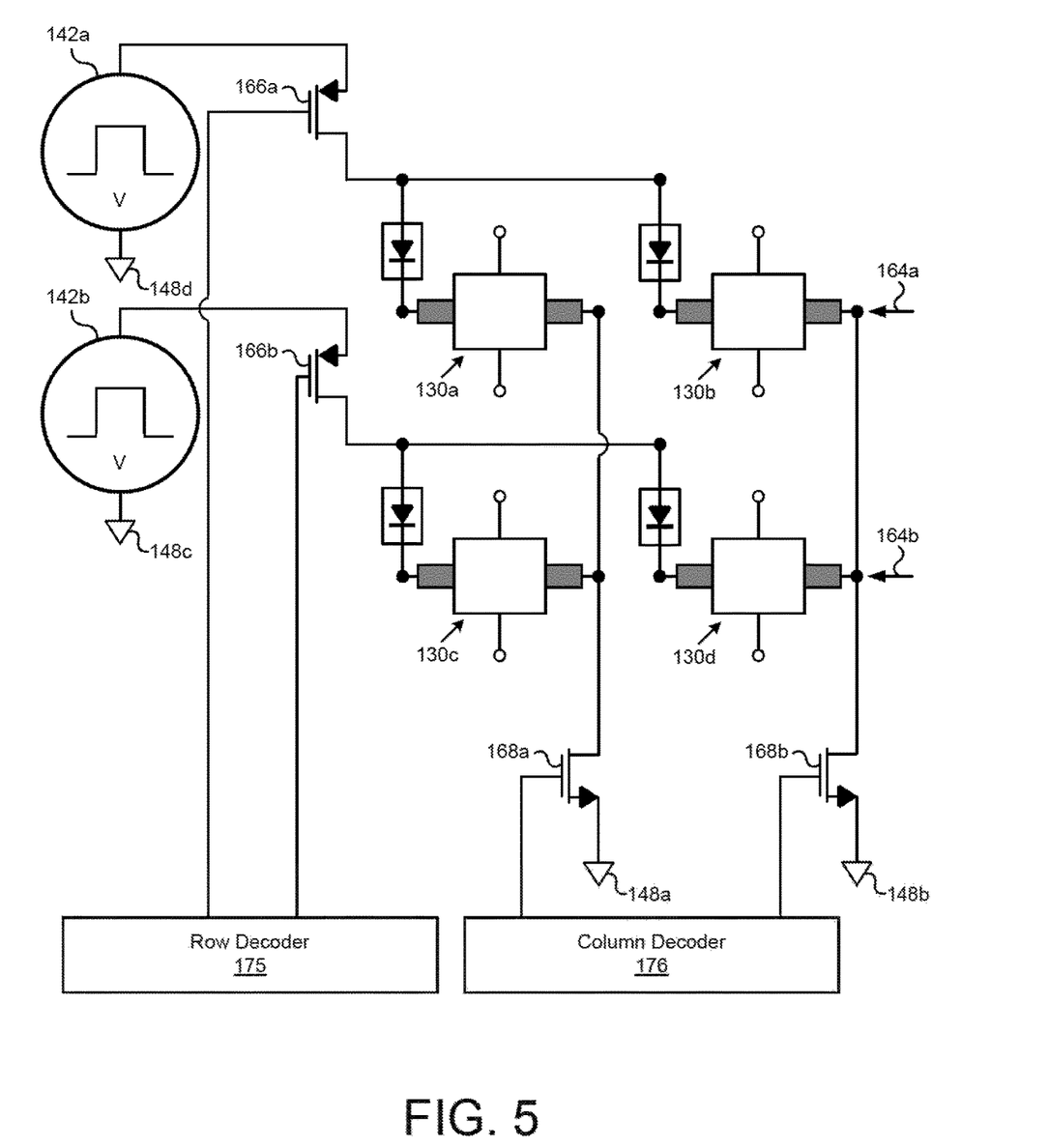
FIG. 5 illustrates an array including multiple shared pulse generators and PCM switching cells according to one implementation of the present application.

FIG. 5 illustrates an array including multiple shared pulse generators and PCM switching cells according to one implementation of the present application. The array in FIG. 5 is similar to the array in FIG. 3, except that a single shared pulse generator 142 is replaced with two shared pulse generators 142a and 142b. Shared pulse generator 142a is coupled between DC ground 148d and the source of row selector 166a, and row selector 166a couples shared pulse generator 142a to row 164a. Shared pulse generator 142b is coupled between DC ground 148c and the source of row selector 166b, and row selector 166b couples shared pulse generator 142b to row 164b.

In contrast to the array in FIG. 3 where shared pulse generator 142 changes the state of a PCM RF switch in a single selected cell, shared pulse generators 142a and 142b in the array in FIG. 5 change the states of PCM RF switches in two selected cells. Row decoder 175 in FIG. 5 is configured to concurrently enable both row selectors 166a and 166b when two cells are selected, enable either row selector 166a or 166b when one cell is selected, and to enable neither when no cell is selected.

For example, it cells 130a and 130c are selected cells, row decoder 175 enables both row selectors 166a and 166b, and column decoder 176 enables column selector 168a. Enabled row selector 166a connects shared pulse generator 142a to selected cell 130a, and enabled row selector 166b connects shared pulse generator 142b to selected cell 130c. Enabled column selector 168a connects both selected cells 130a and 130c to DC wound 148a. Column selector 168b is not enabled and does not provide a path to ground 148b. As a result, shared pulse generator 142a will provide an electrical pulse to cell 130a, shared pulse generator 142b will provide an electrical pulse to cell 130c, and the RCM RF switches in selected cells 130a and 130c will change states.

By using shared pulse generators 142a and 142b, the array in FIG. 5 can change the states of PCM RF switches in two selected cells at a time. Compared to the array in FIG. 3, the array in FIG. 5 decreases switching time when many PCM RF switches are being programmed. Because the array in FIG. 5 utilizes one shared pulse generator per row, a large pulse generator in not used for each PCM RF switch. Accordingly, the array in FIG. 5 balances increased switching time with increased available die area and decreased sources of leakage currents.

Thus, various implementations of the present application achieve an array having a shared pulse generator for PCM RF switches, and utilize the inventive PCM RF switch of the present application, to overcome the deficiencies in the art to increase available die area and decrease sources of leakage currents. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of these concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. An array comprising:
a shared pulse generator;
a plurality of cells, a selected cell in said plurality of cells comprising:
 a non-linear device;
 a phase-change material (PCM) radio frequency (RF) switch;
a row selector configured to connect said shared pulse generator to said selected cell;
a column selector configured to connect said selected cell to a ground;
wherein said shared pulse generator provides an electrical pulse to said PCM RF switch of said selected cell through said non-linear device to change a state of said PCM RF switch.

2. The array of claim 1, wherein said non-linear device is connected to a heating element of said PCM RF switch.

3. The array of claim 1, wherein said non-linear device is selected from the group consisting of a diode, a diode-configured transistor, an ovonic threshold switching device, and a resistive memory element.

4. The array of claim 1, further comprising a row decoder configured to enable said row selector, and a column decoder configured to enable said column selector.

5. The array of claim 1, further comprising:
another row selector configured to connect another shared pulse generator to another selected cell in said plurality of cells;
said column selector further configured to connect said another selected cell to said ground.

6. The array of claim 5, further comprising a row decoder configured to concurrently enable said row selector and said another row selector.

7. The array of claim 1, wherein said electrical pulse causes a heating element of said PCM RF switch to generate a heat pulse.

8. The array of claim 7, wherein said heat pulse transforms an active segment of a PCM of said PCM RF switch, said active segment approximately defined by said heating element.

9. The array of claim 8, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

10. The array of claim 1, wherein said row selector comprises a p-type field effect transistor (PFET).

11. An array comprising:
a shared pulse generator;
a plurality of cells, a selected cell in said plurality of cells comprising:
 a phase-change material (PCM);
 a heating element;
 said heating element transverse to said PCM;
a row selector configured to connect said shared pulse generator to said selected cell;
a column selector configured to connect said selected cell to a ground;
wherein said shared pulse generator provides an electrical pulse to cause said heating element in said selected cell to generate a heat pulse;
wherein another row selector is configured to connect another shared pulse generator to another selected cell in said plurality of cells, and wherein said column selector further configured to connect said another selected cell to said ground.

12. The array of claim 11, further comprising a row decoder configured to concurrently enable said row selector and said another row selector.

13. The array of claim 11, wherein said row selector connects said shared pulse generator to a first terminal of said heating element, and said column selector connects a second terminal of said heating element to said ground.

14. The array of claim 11, further comprising a row decoder configured to enable said row selector, and a column decoder configured to enable said column selector.

15. The array of claim 11, wherein said heat pulse transforms an active segment of said PCM, said active segment approximately defined by said heating element.

16. The array of claim 11, further comprising PCM contacts connected to passive segments of said PCM.

17. The array of claim 11, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

18. The array of claim 11, wherein said row selector comprises a p-type field effect transistor (PFET).

19. An array comprising:
a shared pulse generator;
a plurality of cells, a selected cell in said plurality of cells comprising:
 a phase-change material (PCM);
 a heating element;
 said heating element transverse to said PCM;
a row selector configured to connect said shared pulse generator to said selected cell, wherein said row selector comprises an n-type field effect transistor (NFET), and said row selector is coupled to a level shifter;
a column selector configured to connect said selected cell to a ground;
wherein said shared pulse generator provides an electrical pulse to cause said heating element in said selected cell to generate a heat pulse.

20. The array of claim 19, wherein said PCM is selected from the group consisting of germanium telluride ($Ge_XTe_Y$), germanium antimony telluride ($Ge_XSb_YTe_Z$), germanium selenide ($Ge_XSe_Y$), and any other chalcogenide.

* * * * *